Nov. 13, 1956 C. C. BOPP ET AL 2,770,731
TRANSISTOR OSCILLATOR
Filed Aug. 17, 1954
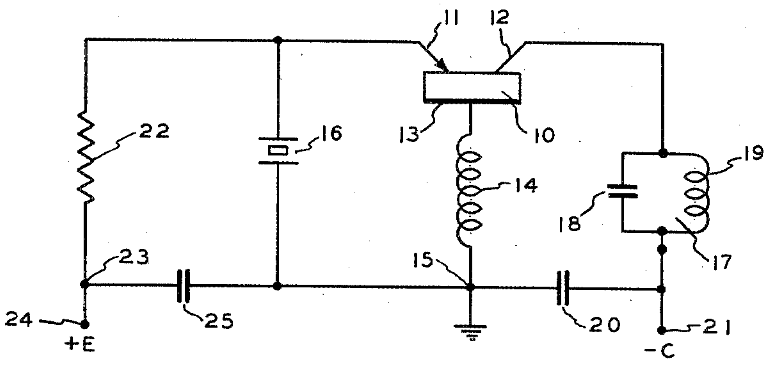
INVENTORS.
CALVIN C. BOPP.
RICHARD W. BRADMILLER.
BY Alden D. Redfield.
ATTORNEY.

United States Patent Office 2,770,731

Patented Nov. 13, 1956

2,770,731

TRANSISTOR OSCILLATOR

Calvin C. Bopp and Richard W. Bradmiller, Cincinnati, Ohio, assignors to Avco Manufacturing Corporation, Cincinnati, Ohio, a corporation of Delaware Application August 17, 1954, Serial No. 450,384

7 Claims. (Cl. 250—36)

The present invention relates generally to oscillators, and more particularly to a sine wave crystal controlled oscillator including a three-electrode semi-conductor unilateral control device adjusted to perform as a negative resistance.

Three-electrode semi-conductor unilateral control devices are commonly known as "transistors," and have only in recent years been understood, described, and commonly employed in electronic circuitry. The transistor is, as commonly employed, an amplifier, and in its presently common form employs a block of semi-conducting material, such as silicon or germanium containing lattice imperfections, which is provided on one of its surfaces with two closely adjacent electrodes, called emitter and collector electrodes, and with a third electrode called a base electrode. The base electrode provides a large-area low-resistance contact with one surface of the semi-conductor block, while the remaining electrodes provide small-area rectifying contacts. The input circuit of a transistor amplifier is usually connected between the emitter and base electrodes, while the output circuit is usually connected between the collector and base electrodes. Since the base electrode is simultaneously in circuit with both emitter and collector electrodes, it may be operated at ground or reference potential, if desired, or an impedance may be interposed between the base electrode and ground. In the latter case the impedance is commonly in the base, emitter, and collector circuits.

Transistor oscillators may be broadly classified as (1) voltage feed-back oscillators, (2) current feed-back oscillators, employing a negative resistance characteristic of the transistor, which exists under certain operating conditions. The latter application is possible only when utilizing transistors having current amplification greater than unity, and makes possible a number of circuits which are not analogous to any known vacuum tube oscillator circuit.

It can be shown that negative resistance may inhere in a transistor circuit including current gain greater than unity, and that oscillations may be produced by sufficiently increasing the impedance in the base circuit and/or decreasing the impedance in the emitter and/or collector circuits of a transistor amplifier. By providing a proper relationship among these impedances sinusoidal oscillations may be generated, because the circuit then possesses negative resistance. The required relationships are understood by those skilled in the art. In general these conditions are that $$\frac{Ze}{Zb} \leq \alpha - 1 \text{ where } \alpha = \frac{r_m - Ze}{Zc}$$

In these algebriac expressions, as applied to a transistor amplifier, $Ze$=impedance in emitter circuit
$Zb$=impedance in base circuit
$Zc$=impedance in collector circuit
$r_m$=the internal impedance of a fictitious voltage generator, having a voltage $r_m ie$, where $ie$ is emitter current The frequency of oscillation of a transistor circuit, operative as an oscillator by virtue of negative resistance, may be established by a piezo-electric crystal, connected in the emitter circuit, the piezo-electric crystal operating in its series resonant mode. When so operated the piezo-electric crystal provides low impedance in the emitter circuit, which is one of the requirements that oscillations may occur.

A high base impedance, also essential to operation in the negative resistance mode, may be established by providing a resistance between the base electrode and ground, or by connecting a parallel resonant circuit between the base electrode and ground. The last mentioned expedients are known in the prior art. However, utilization of a resistance in the base circuit unduly increases the losses of the oscillator, and complicates the provision of bias voltages, and therefore does not represent an ideal circuit arrangement. Utilization of a parallel tuned circuit in the base circuit permits operation with base grounded for d. c., but involves utilization of a tuned circuit additional to that provided by the piezo-electric crystal itself. The phase of the current fed by the base circuit into the emitter circuit is then subject to variation, as operating conditions of the oscillator vary, and for these and other reasons, the oscillator becomes relatively unstable under many practical conditions of operation.

I have found that the inclusion of an inductance only, between base electrode and ground, in a transistor oscillator operated as a negative resistance device having a crystal oscillator in its emitter circuit, provides highly stable oscillator operation, and that an oscillator so arranged maintains its stability under a wide variety of operating conditions, including load variation, variation of supply voltage, and variation of temperature and of transistor parameters. I believe this advantageous result is attained by virtue of the stability of phase of feed-back current in the base circuit inductance. However, I do not desire to be bound by any specific theory of operation. It further appears that the presence of a tuned circuit in the base circuit of the transistor establishes a resonant mode for the oscillator, the frequency of which is in considerable degree established by the parameters of the entire oscillator circuit, and that under some conditions of operation the piezo-electric crystal may lose control of the oscillator to the base circuit. This possibility is avoided by following the practice of the present invention.

It is, accordingly, a primary object of the present invention to provide a novel highly stable sine wave oscillator which includes a three-electrode semi-conductor device.

It is another object of the present invention to provide a novel highly stable sine-wave oscillator including a three-electrode semi-conductor device, in which the oscillator is stabilized by a piezo-electric crystal in the emitter circuit of the semi-conductor device, and is caused to oscillate by adjusting the parameters of the circuit to provide negative resistance.

Still another object of the present invention is to provide a crystal controlled oscillator incorporating a semi-conductor device of the type having an emitter electrode, a collector electrode and a base electrode and in which an inductance is the sole impedance included in the base circuit of the device.

Briefly describing the present invention, a sine wave oscillator in accordance therewith comprises a transistor having an emitter electrode, a collector electrode, and a base electrode. The base electrode makes low-resistance non-rectifying contact with a semi-conducting body, while the emitter and collector electrodes make small, high resistance rectifying contact with the semi-conductor body. In the normal arrangement a reverse bias is applied between the collector and base electrodes, and a forward bias between the emitter and base electrodes.

In accordance with the principles of the present invention, a piezo-electric crystal is connected directly between the emitter electrode and a ground point, and a relatively high inductance between the base electrode and the ground point. The crystal is operated in its series resonant mode, and suitable bias voltage is supplied to the emitter electrode via a resistance shunting the crystal.

An output circuit for the oscillator may take the form of a parallel tuned circuit connected at one terminal directly to the transistor collector electrode, and at the remaining terminal via a coupling and by-pass condenser to the ground point. Bias voltage may then be supplied to the collector electrode via the inductance of the parallel tuned circuit.

The emitter circuit is, in the system hereinabove described, of low impedance, and the base circuit of high impedance. On suitable choice of input and base circuit parameters, the impedance presented at the base is negative, and oscillations occur. These oscillations appear in the resonant collector tank circuit, and by tuning the tank circuit to the fundamental frequency, or to a selected harmonic frequency, the oscillator of the present invention may operate at the fundamental frequency of the crystal, or as a frequency multiplier type oscillator. Tuning the collector circuit over a limited range, however, has only a negligible effect on the frequency operation.

The novel features of the invention are particularly pointed out in the appended claims. The invention, in a preferred embodiment thereof, as well as additional features, objects, and advantages thereof, will be understood from the following description, when read in conjunction with the accompanying drawing wherein the single figure is a schematic circuit diagram of a crystal controlled transistor oscillator arranged in accordance with the invention.

Referring now more specifically to the accompanying drawing, the reference numeral 10 denotes a body of semi-conducting material, such as germanium, containing a small number of lattice imperfections, in the form of atomic impurity centers. The semi-conducting body 10 is provided with an emitter electrode 11, a collector electrode 12 and a base electrode 13. The emitter electrode 11 and the collector electrode 12 are small area rectifying contacts, ordinarily placed closely adjacent one another, and in contact with the semi-conducting body 10, on one side thereof. Base electrode 13 provides a large-area low-resistance non-rectifying contact with the semi-conducting body 10.

An inductance 14 is connected between the base electrode 13 and a ground point 15, the latter constituting a point of reference potential for the oscillator. Connected directly between the emitter electrode 11 and the ground point 15 is a piezo-electric circuit 16, provided with suitable electrodes, and ground to resonate in the series resonant mode at the desired frequency of oscillation. Connected directly to the collector electrode 12 is one terminal of a parallel resonant circuit 17, consisting of a condenser 18 and an inductance 19, connected in parallel with each other. The other terminal of the parallel resonant circuit 17 is coupled via a low reactance condenser 20 to the ground point 15, and also to a negative bias terminal 21.

The emitter electrode 11 is connected directly to one terminal of a bias resistance 22, the other terminal of which, 23, is connected to a positive voltage terminal 24, and via a low reactance by-pass condenser 25 to the ground point 15.

At the series resonant frequency of the piezo-electric crystal 16, which may be, for example only, 3.5 mc., the crystal presents a low impedance from emitter to ground, a condition required for oscillation in the negative resistance mode. At this frequency one crystal employed in a practical embodiment of the invention oscillated at approximately 800 C. P. S. below the frequency appropriate to the parallel resonant mode. Oscillations were stable in the series resonant mode but since in the parallel resonant mode the crystal presents a high impedance, which will not enable the transistor to sustain oscillations.

Feed-back is supplied by the inductance 14 in the base lead, the phase of this feed-back being relatively fixed. Extremely stable operation was encountered, over a wide range of operating conditions, in tests conducted on an oscillator constructed in accordance with the invention. For example, for variations of supply voltage between −50% to +30% of nominal value the output frequency varied by relatively few cycles per second, i. e. less than 100 C. P. S., and likewise, variation of transistor temperature from room ambient to the point at which oscillations ceased caused a frequency change of relatively few cycles per second, i. e. less than 100 C. P. S., and frequency remained substantially unchanged with substitution of transistors.

In one practical embodiment of the present circuit values were employed as follows:

| | |
|---|---|
| Transistor type | WE1698. |
| Crystal type | FT243. |
| Inductance **14** | 30 μh. |
| Inductance **19** | 6μh. |
| Capacitor **18** | 40 μμf. |
| Capacitors **20** and **25** | .01 μf. |
| Resistance **22** | 5.6 k. |

The values indicated imply that the tank circuit 17 operates at a harmonic frequency, i. e., at about 10 mc. However, other values of capacitance 18, and/or inductance 19 may be substituted, suitable for operation at the fundamental frequency of the oscillator crystal 16, or at any one of a plurality of different harmonics thereof, providing the impedance of the output tuned circuit is made low enough to satisfy the equation $$\frac{Ze}{Zb} \leq \alpha - 1 \text{ where } \alpha = \frac{r_m - Ze}{Zc}$$

as previously considered.

While we have described and illustrated a specific embodiment of the present invention, it will be apparent that variations of circuit parameters and of general arrangement may be resorted to without departing from the true spirit and scope of the invention as defined in the appended claims.

What we claim is:

1. A point contact transistor oscillator including a transistor having a base electrode, an emitter electrode, and a collector electrode, a circuit consisting of an inductance connected between said base electrode and a point of reference potential, a series-resonant mode piezo-electric crystal connected between said emitter electrode and said point of reference potential, a tank output circuit connected between said collector electrode and said point of reference potential, and means for applying bias voltages to said emitter and collector electrodes.

2. A point contact transistor oscillator including a transistor having a base electrode, a collector electrode, and an emitter electrode, a circuit consisting of a first inductance connected between said base electrode and a point of reference potential, a piezo-electric crystal resonating in its series resonant mode connected between said emitter electrode and said point of reference potential, a parallel resonant tank circuit including a parallel connected second inductance and a condenser, means coupling said tank circuit between said collector electrode and said point of reference potential, a terminal for supplying bias voltage to said collector electrode, and means connecting said terminal to said collector electrode via said second inductance.

3. A point contact transistor oscillator including a transistor amplifier having a current gain greater than unity, said transistor amplifier including a base electrode, a collector electrode, and an emitter electrode, a series resonant circuit connected between said emitter electrode and a point of reference potential, an inductance only connected between said base electrode and said point of reference potential, and an output circuit connected to said collector electrode.

4. The combination in accordance with claim 3 wherein said output circuit is a circuit tuned substantially to the resonant frequency of said series resonant circuit.

5. The combination in accordance with claim 3 wherein said output circuit is a circuit tuned to a harmonic of the resonant frequency of said series resonant circuit.

6. The combination in accordance with claim 3 wherein said series resonant circuit includes a piezo-electric crystal resonant in its series resonant mode.

7. A point contact transistor oscillator including a transistor amplifier having a gain greater than unity, said transistor amplifier including a base electrode, an emitter electrode, and a collector electrode, an inductance connected between said base electrode and a point of reference potential, said inductance constituting the sole reactance between said base electrode and said point of reference potential, a series resonant circuit connected between said emitter electrode and said point of reference potential, and a two-terminal tuned output circuit for said oscillator coupled at one of said terminals to said point of reference potential, the circuit parameters of said oscillator being selected to establish operation of said transistor amplifier on a negative resistance portion of its input characteristic.

References Cited in the file of this patent

UNITED STATES PATENTS 2,311,163 Edwards -------------- Feb. 16, 1943

OTHER REFERENCES

"Precision Transistor Oscillator," from National Bureau of Standards Technical News Bulletin, pages 17 to 19, vol. 37, No. 2, dated February 1953.

"Duality as a Guide in Transistor Circuit Design," from Bell System Monograph 1874, by Wallace et al., pages 1 to 15.